(12) United States Patent
Yoo

(10) Patent No.: US 6,683,795 B1
(45) Date of Patent: Jan. 27, 2004

(54) SHIELD CAP AND SEMICONDUCTOR PACKAGE INCLUDING SHIELD CAP

(75) Inventor: Duc Su Yoo, Kuri (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 10/121,215

(22) Filed: Apr. 10, 2002

(51) Int. Cl.[7] ................................................ H05K 9/00
(52) U.S. Cl. ....................... 361/816; 361/818; 361/800; 361/697; 174/35 R; 174/52.4; 257/704; 257/706; 257/724
(58) Field of Search ................................. 361/818, 816, 361/800, 764, 760, 719, 799, 502, 697, 707, 714; 257/704, 706, 707, 723, 724; 174/35 R, 51, 52.4

(56) References Cited

U.S. PATENT DOCUMENTS

| | | | |
|---|---|---|---|
| 4,838,475 A | * | 6/1989 | Mullins et al. ........... 228/179.1 |
| 4,922,376 A | * | 5/1990 | Pommer et al. ............. 361/715 |
| 5,347,429 A | | 9/1994 | Kohno et al. |
| 5,457,605 A | * | 10/1995 | Wagner et al. .............. 361/720 |
| 5,463,253 A | | 10/1995 | Waki et al. |
| 5,474,957 A | | 12/1995 | Urushima |
| 5,474,958 A | | 12/1995 | Djennas et al. |
| 5,581,498 A | | 12/1996 | Ludwig et al. |
| 5,625,228 A | * | 4/1997 | Rogren ........................ 257/712 |
| 5,674,785 A | | 10/1997 | Akram et al. |
| 5,739,581 A | | 4/1998 | Chillara et al. |
| 5,739,585 A | | 4/1998 | Akram et al. |
| 5,773,884 A | * | 6/1998 | Andros et al. .............. 257/707 |
| 5,798,014 A | | 8/1998 | Weber |
| 5,835,355 A | | 11/1998 | Dordi |
| 5,894,108 A | | 4/1999 | Mostafazadeh et al. |
| 5,903,052 A | | 5/1999 | Chen et al. |
| 5,931,222 A | * | 8/1999 | Toy et al. ................... 165/80.3 |
| 5,952,611 A | | 9/1999 | Eng et al. |
| 6,013,948 A | | 1/2000 | Akram et al. |
| 6,034,427 A | | 3/2000 | Lan et al. |
| 6,060,778 A | | 5/2000 | Jeong et al. |
| 6,072,243 A | | 6/2000 | Nakanishi |
| 6,122,171 A | | 9/2000 | Akram et al. |
| 6,127,833 A | | 10/2000 | Wu et al. |
| 6,160,705 A | | 12/2000 | Stearns et al. |
| 6,172,419 B1 | * | 1/2001 | Kinsman ..................... 257/737 |
| 6,184,463 B1 | | 2/2001 | Panchou et al. |
| 6,214,641 B1 | | 4/2001 | Akram |
| 6,235,554 B1 | | 5/2001 | Akram et al. |
| 6,343,020 B1 | * | 1/2002 | Lin et al. ..................... 361/816 |
| 6,395,578 B1 | | 5/2002 | Shin et al. |
| 6,501,016 B1 | * | 12/2002 | Sosnowski ................ 174/35 R |

FOREIGN PATENT DOCUMENTS

| | | |
|---|---|---|
| JP | 05136323 A | 1/1993 |
| JP | 05109975 A | 3/1993 |
| JP | 10-173085 | 6/1998 |

* cited by examiner

*Primary Examiner*—David Martin
*Assistant Examiner*—Hung Bui
(74) *Attorney, Agent, or Firm*—Weiss, Moy & Harris, P.C.

(57) ABSTRACT

A shield cap and a semiconductor package including a shield cap provide protection for passive components mounted on a substrate of a semiconductor package. The shield cap provides a means for manufacturing a semiconductor package that includes a semiconductor die and passive components without encapsulating the passive components within the encapsulation protecting the semiconductor die. The shield cap provides electromagnetic shielding and physical protection for the passive components and may provide thermal conduction from a semiconductor die by contacting the semiconductor die. The shield cap may be perforated to permit air circulation through the shield cap for providing improved thermal performance or may be a solid metal shield, providing improved electromagnetic shielding.

17 Claims, 2 Drawing Sheets

SHIELD CAP AND SEMICONDUCTOR PACKAGE INCLUDING SHIELD CAP

FIELD OF THE INVENTION

The present invention relates generally to integrated circuit packaging and more specifically, to semiconductor packaging methods and assemblies for packaging integrated circuit dies along with passive elements.

BACKGROUND OF THE INVENTION

Semiconductor packages are fabricated in various structures, but all of the structures generally include an encapsulation around a semiconductor die that includes integrated electronic circuits. The encapsulation provides protection from external environments. A substrate, such as a lead frame, a printed circuit board (PCB), a circuit film, a circuit tape, or a similar structure is included for interconnecting various input/output signals to and from the semiconductor die.

Among the differing types of semiconductor packages, there are semiconductor packages including passive components, such as resistors R, capacitors C, inductors L, and other passive components mounted within the semiconductor package. One such semiconductor package for a self-contained system has the passive components mounted on a surface of a substrate described above, such as the resistors, the capacitors, and the inductors. Another semiconductor package includes passive components and semiconductor dies mounted to one face of a substrate, and solder balls fused to the other face of the substrate. This second type of semiconductor package is used to reduce the size of the semiconductor package where otherwise a large area would be required if the semiconductor dies and the passive components were mounted on the same face of the substrate.

As the semiconductor packages are included within mobile modules and radio frequency (RF) devices such as cellular phones and Personal Digital Assistants (PDAs), the semiconductor packages are required to have excellent thermal properties to provide product reliability. However, since the above-described prior art semiconductor packages have passive components encapsulated along with the semiconductor dies, they have poor heat dissipation characteristics.

Therefore, it would be desirable to provide a semiconductor package including passive components that has improved heat dissipation characteristics.

SUMMARY OF THE INVENTION

The above stated objectives are achieved in a shield cap and semiconductor package including a shield cap whereby a semiconductor die is packaged in conjunction with passive elements. The semiconductor package assemblies include at least one passive component, a substrate with a central cavity for mounting a semiconductor die and a shield cap attached to the bottom surface of the substrate for covering and protecting the passive components. The substrate includes multiple electrically conductive patterns formed on the top surface and bottom surface and the electrically conductive patterns on the bottom surface include mounting pads for mounting the passive components.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1:
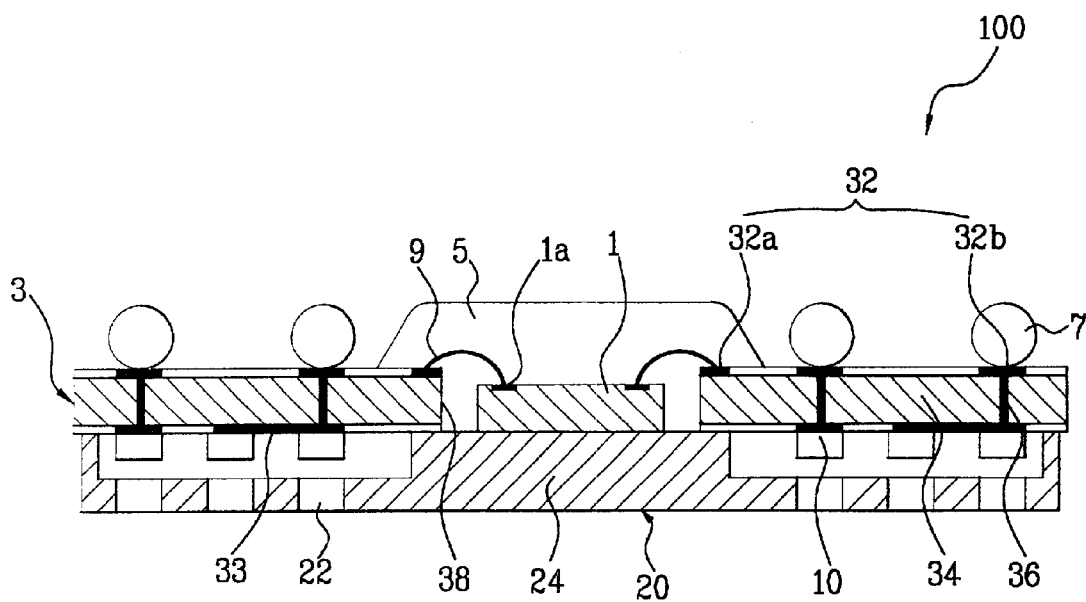
FIG. 1 illustrates a sectional view of a semiconductor package including passive components and a shield cap in accordance with one embodiment of the present invention.

Referring to FIG. 1, a sectional view of a semiconductor package 100 including passive components 10 in accordance with one embodiment of the present invention is illustrated. Semiconductor package 100 includes a semiconductor die 1, a substrate 3 including a cavity 38 for placing the semiconductor die 1 within, a plurality of solder balls 7 each for conducting an electrical signal between semiconductor die 1 and the outside of substrate 3, a plurality of passive components 10 mounted to a second conductive layer 33 of substrate 3, an encapsulant 5 encapsulating semiconductor die 1 and covering cavity 38 for protecting exposed circuit patterns, and a shield cap 20 for protecting passive components 10.

Semiconductor die 1 is fabricated by forming a pure $SiO_2$ crystal extracted from sand and cut to form a wafer, and forming an integrated circuit on one face thereof. The semiconductor die 1 is in general square or rectangular, with a plurality of bond pads 1a formed on the face of the integrated circuit for connection of electrical signals to and from the integrated circuit. Bond pads 1a are arranged on one line on the periphery or a central part of the semiconductor die 1. Bond pads 1a are connected to a plurality of bond fingers 32a of a first conductive layer 32 on substrate 3 for interconnecting the electrical signals of semiconductor die 1.

Semiconductor die 1 is mounted in cavity 38, which is formed in a central part of substrate 3. Substrate 3 includes first conductive layer 32 and second conductive layer 33 for connection of electrical signals through bond pads 1a on the semiconductor die 1. First conductive layer 32 and second layer 33 are formed on opposite side of a dielectric layer 34. First conductive layer 32 and second conductive layer 33 are electrically connected to each other by a plurality of conductive vias 36.

After semiconductor die 1 is placed in cavity 38, a plurality of wires 9 are bonded between bond pads 1a of the semiconductor die 1 and bond fingers 32a of the substrate 3 to electrically connect semiconductor die 1 and substrate 3. Wires 9 may be any conductive material such as aluminum (Al), gold (Au), copper (Cu) or an equivalent. While bonding wires 9 to bond pads 1a and bond fingers 32a, each end of the wires are exposed to a momentary high temperature, generated by an over-voltage applied to melt the ends, welding wires 9 onto bond pads 1a and bond fingers 32a.

After wires 9 are bonded, semiconductor die 1 is encapsulated. Semiconductor die 1 is encapsulated to protect semiconductor die 1 against external environments. Bond fingers 32a and wires 9 are also subject to oxidation and impact breakage if substrate 3 and wires 9 are exposed to the exterior. Therefore, wires 9 and bond fingers 32a are also encapsulated. Epoxy Mold Compound (EMC) is a preferred encapsulant for forming encapsulation 5. The EMC is molded in a metal mold with pressure and heat. Recently powder epoxy and paste epoxy are used, which directly coated on the assembly and fixed via pressure and/or heat. Solder balls 7 are attached to surfaces except the central encapsulated part of the substrate 3. Solder balls 7 provide external electrical connections for semiconductor package 100. Electrical signals reach semiconductor die 1 and passive components 10 via first and second conductive layer 32 and 33 of substrate 3 from solder balls 7 provided on the exterior of semiconductor package 100. Solder balls 7 are fused to a plurality of lands 32b of first conductive layer 32.

As described above, passive components 10 are mounted to second conductive layer 33, which opposes first conductive layer 32. As passive components 10 are mounted within semiconductor package 100, the semiconductor package becomes a stand-alone processing system. Shield cap 20 is attached to the face of substrate 3 to which passive components 10 are mounted. A perspective view of the shield cap 20 is illustrated in FIG. 2.

Figure 2:
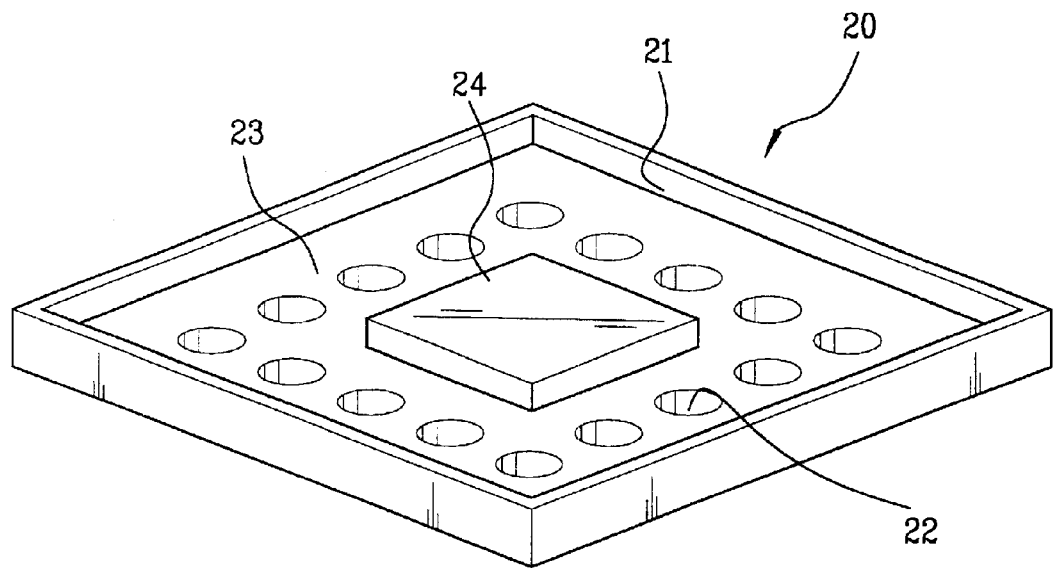
FIG. 2 illustrates a perspective view of the shield cap of FIG. 1.

Referring now to both FIG. 1 and FIG. 2 shield cap 20 is rectangular or square and of a size substantially equal to the outline of the semiconductor package. Shield cap 20 includes a vertical wall 21 on each side. Vertical wall 21 contacts substrate 3 forming a space within for accommodating passive components 10. Shield cap 20 include a base panel 23 in a lower part thereof for covering the passive components 10, and a heat dissipation portion 24 projecting from a central part of base panel 23. Heat dissipation portion 24 is of an area similar to do the area of semiconductor die 1. The material of the shield cap 20 may be any metal material such as aluminum, copper or an equivalent.

Heat dissipation portion 24 has a height great sufficient to provide contact with semiconductor die 1 when shield cap 20 is attached to the bottom of substrate 3. Base panel 23 includes a plurality of holes 22 formed through shield cap 20. The shape of the holes 22 is not limited by the illustration and may be any shape.

Shield cap 20 is attached to the bottom of the substrate 3 and covers passive components 10. When the top surface of the heat dissipation part 24 is brought into surface to surface contact with the bottom of the semiconductor die 1, a space is formed between the bottom of substrate 3 and base panel 23 of the shield cap 20. Prior to mounting of shield cap 20, passive components 10 are disposed in this space. Therefore, the passive components 10 are protected not by encapsulant 5 but are protected by shield cap 20 covering passive components 10.

Shield cap 20 serves to not only protect passive components 10, but also provides heat dissipation. Shield cap 20 is attached to the semiconductor die 1 and substrate 3 for effective heat dissipation from semiconductor die 1 and the passive components 10.

Further, malfunction of the passive components 10 caused by external electromagnetic waves can be eliminated, as base panel 23 of shield cap 20 shields passive components 10 from external electromagnetic waves.

Figure 3:
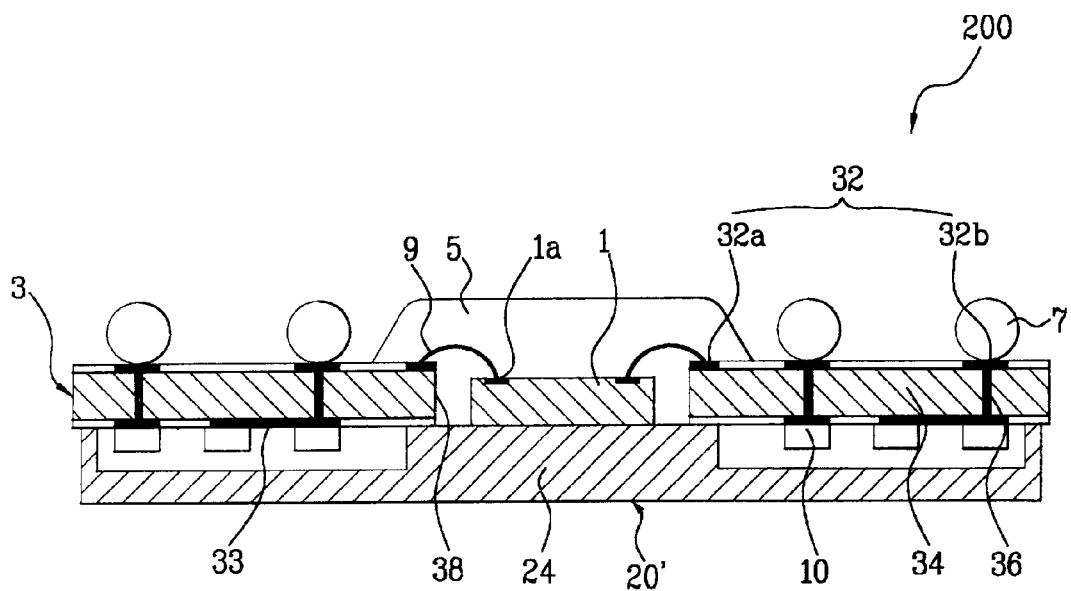
FIG. 3 illustrate a sectional view of a semiconductor package including passive components and a shield cap in accordance with another embodiment of the present invention.
Figure 4:
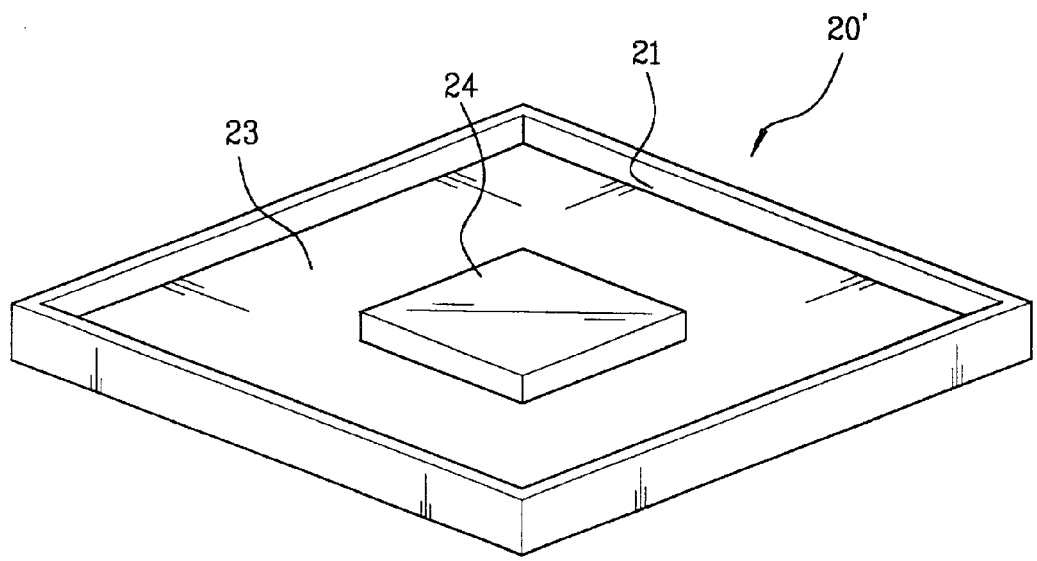
FIG. 4 illustrates a perspective view of the shield cap of FIG. 3.

Referring now FIG. 3, a semiconductor package 200 in accordance with an alternative embodiment of the invention is depicted. Semiconductor package 200 is similar to semiconductor package 100 of FIG. 1, but includes a different shield cap 20' as shown. Referring additionally to FIG. 4, shield cap 20' as shown in FIG. 3 and 4 has no holes, improving electromagnetic shielding around passive components 10.

Since the semiconductor packages of the present invention have passive components mounted to a second conductive layer of a substrate, the total area of the semiconductor package can be reduced and more passive components may be mounted therein. Additionally, the shield cap of the present invention provides physical protection of the passive components, shielding from external electromagnetic waves, and heat dissipation from the semiconductor die and the passive components to the exterior.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package comprising:
   at least one passive component for providing an electrical function of the semiconductor package;
   a substrate defining a central cavity for mounting a semiconductor die and having a plurality of electrically conductive patterns formed on a top surface and a bottom surface thereof, wherein the electrically conductive patterns on the bottom surface include mounting pads for mounting the at least one passive component;
   a semiconductor die mounted within the cavity and having bond pads electrically connected to the conductive patterns on the substrate; and
   a shield cap attached to the bottom surface of the substrate for covering and protecting the at least one passive component, wherein the shield cap includes a raised area disposed in the center of the shield cap for contacting the semiconductor die, thereby conducting heat from the semiconductor die to the shield cap.

2. The semiconductor package of claim 1, wherein the shield cap includes a vertical wall disposed at the periphery of the shield cap for mounting the shield cap to the substrate, whereby the shield cap is supported above the at least one passive component.

3. The semiconductor package of claim 1, wherein the shield cap is metal shield cap for providing improved electromagnetic shielding and heat conduction.

4. The semiconductor package of claim 1, wherein the shield cap includes a plurality of perforations through the surface parallel to the substrate for providing air circulation through the shield cap.

5. The semiconductor package of claim 1, further comprising an encapsulation covering the semiconductor die.

6. The semiconductor package of claim 1, wherein the electrically conductive patterns on the top side of the substrate include a plurality of bond fingers, and wherein the semiconductor package further comprises a plurality of wires each having a first end bonded one of the bond pads and a second end bonded to one of the bond pads on the semiconductor die.

7. The semiconductor package of claim 1, wherein the electrically conductive patterns on the top side of the substrate include a plurality of lands and wherein the semiconductor package further comprises a plurality of conductive balls fused to the lands, whereby the semiconductor package may be electrically connected to an external device.

8. The semiconductor package of claim 1, wherein the central cavity is an aperture that passes entirely through the central area of the substrate.

9. The semiconductor package of claim 1, wherein the shield cap includes a vertical wall disposed at the periphery of the shield cap for mounting the shield cap to the substrate, whereby the shield cap is supported above the at least one passive component.

10. The semiconductor package of claim 9, wherein the shield cap includes a plurality of perforations through the surface parallel to the substrate for providing air circulation through the shield cap.

11. The semiconductor package of claim 10, further comprising an encapsulation covering the semiconductor die.

12. A shield cap for mounting on a semiconductor package, whereby a plurality of passive components mounted underneath the shield cap are protected from external impact when the shield cap is mounted to a substrate whereon the passive components are mounted, the shield cap comprising:

a thin rectangular plate defining a top surface and a bottom surface of the shield cap and including a raised rectangular region in the center of the top surface of the rectangular plate, whereby the raised rectangular region makes contact with a semiconductor die mounted to the substrate through a cavity in the substrate when the shield cap is mounted to the substrate, for conducting heat from the semiconductor die; and a wall disposed around the periphery of the rectangular plate and extending out from the top surface of the rectangular plate by a predetermined height whereby the rectangular plate is supported at the predetermined height above the substrate when mounted to the substrate.

13. The shield cap of claim 12, wherein the thin rectangular plate defines a plurality of perforations through the thin rectangular plate for permitting a passage of air through the shield cap.

14. The shield cap of claim 12, wherein the shield cap is metal shield cap for providing improved electromagnetic shielding and heat conduction.

15. A semiconductor package, comprising:

at least one passive component for providing an electrical function of the semiconductor package;

a substrate defining a central cavity for mounting a semiconductor die and having a plurality of electrically conductive patterns formed on a top surface and a bottom surface thereof, wherein the electrically conductive patterns on the bottom surface include mounting pads for mounting the at least one passive component;

a semiconductor die mounted within the cavity and having bond pads electrically connected to the conductive patterns on the substrate; and means for covering and protecting the at least one passive component from physical impact the covering and protecting means including a raised rectangular region in the center of a top surface of the covering and protecting means, whereby the raised rectangular region may make contact with the semiconductor die when the covering and protecting means is mounted to the substrate, for conducting heat from the semiconductor die.

16. The semiconductor package of claim 15, wherein the covering means further comprises support means for supporting the shield cap above the at least one passive component.

17. The semiconductor package of claim 15, wherein the covering means further comprises air circulation means for permitting air to pass through the covering means.

* * * * *